United States Patent
Jeong (10) Patent No.: US 9,184,749 B2
(45) Date of Patent: Nov. 10, 2015

(54) IMPEDANCE CALIBRATION CIRCUITS

(71) Applicant: SK hynix Inc., Icheon-si Gyeonggi-do (KR)

(72) Inventor: Hyun Sik Jeong, Seoul (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/177,499

(22) Filed: Feb. 11, 2014

(65) Prior Publication Data

US 2015/0091611 A1    Apr. 2, 2015

(30) Foreign Application Priority Data

Sep. 30, 2013   (KR) .................... 10-2013-0116209

(51) Int. Cl.
| | |
|---|---|
| H03K 17/16 | (2006.01) |
| H03K 19/003 | (2006.01) |
| H03K 19/00 | (2006.01) |
| G11C 29/02 | (2006.01) |
| H04L 25/00 | (2006.01) |
| G11C 29/50 | (2006.01) |

(52) U.S. Cl.
CPC .......... *H03K 19/0005* (2013.01); *G11C 29/022* (2013.01); *G11C 29/028* (2013.01); *H04L 25/00* (2013.01); *G11C 29/50008* (2013.01)

(58) Field of Classification Search
None
See application file for complete search history.

(56) References Cited

U.S. PATENT DOCUMENTS 7,410,293 B1 * 8/2008 Santurkar et al. ............. 374/178
2012/0002697 A1 * 1/2012 Cho ................................ 374/45

FOREIGN PATENT DOCUMENTS

| KR | 1020100124896 A | 11/2010 |
|---|---|---|
| KR | 1020110097470 A | 8/2011 |
| KR | 101069733 B1 | 9/2011 |

OTHER PUBLICATIONS

Daeyong Shim et al., "A Process-Variation-Tolerant On-Chip CMOS Thermometer for Auto Temperature Compensated Self-Refresh of Low-Power Mobile DRAM," IEEE Journal of Solid-State Circuits, Oct. 2013, pp. 2550-2557, vol. 48, No. 10, IEEE.

* cited by examiner

*Primary Examiner* — Anh Tran
(74) *Attorney, Agent, or Firm* — William Park & Associates Ltd.

(57) ABSTRACT

Impedance calibration circuits are provided. The impedance calibration circuit includes an operation control signal generator and an impedance calibrator. The operation control signal generator receives temperature code signals to generate an operation control signal enabled when an internal temperature is changed from a first temperature to a second temperature. The impedance calibrator receives an external command signal or the operation control signal to generate pull-up code signals for pulling up an output signal and pull-down code signals for pulling down the output signal according to an external resistor.

18 Claims, 8 Drawing Sheets

IMPEDANCE CALIBRATION CIRCUITS

CROSS-REFERENCES TO RELATED APPLICATIONS

The present application claims priority under 35 U.S.C 119(a) to Korean Application No. 10-2013-0116209, filed on Sep. 30, 2013, in the Korean Intellectual Property Office, which is incorporated herein by reference in its entirety as set forth in full.

BACKGROUND

1. Technical Field

Embodiments of the present disclosure relate to semiconductor integrated circuits and, more particularly, to impedance calibration circuits.

2. Related Art

Within semiconductor systems, it is generally necessary to match the impedance of a transmission line (e.g., a transmission channel) with the corresponding termination impedance of a termination resistor in order to prevent undesirable signal reflections. Such signal reflections act as noise on the transmission line in relation to signals subsequently transmitted on the transmission line. Termination resistors of conventional semiconductor modules or systems are often disposed outside semiconductor chips constituting the semiconductor modules or systems. However, in the event that the termination resistors are disposed outside high performance semiconductor chips such as double data rate 2 (DDR2) synchronous dynamic random access memory (SDRAM) chips, there may be some limitations in preventing undesirable signal reflections.

Recently, termination resistors have been provided inside high performance semiconductor chips to prevent undesirable signal reflections. That is, on-die termination (ODT) circuits have been widely used in semiconductor modules and/or semiconductor systems. The ODT circuits include switching circuits, which are turned on or off to control currents that flow therein. Thus, power consumption of the semiconductor modules including ODT circuits may be reduced as compared with semiconductor modules including termination resistors disposed outside the semiconductor chips. Resistance values of the ODT circuits may vary according to process/voltage/temperature (PVT) conditions. Hence, it may be necessary to calibrate the resistance values of the ODT circuits using impedance calibration circuits before the ODT circuits are utilized.

SUMMARY

Various embodiments are directed to impedance calibration circuits.

According to some embodiments, an impedance calibration circuit includes an operation control signal generator and an impedance calibrator. The operation control signal generator receives temperature code signals to generate an operation control signal enabled when an internal temperature is changed from a first temperature to a second temperature. The impedance calibrator receives an external command signal or the operation control signal to generate pull-up code signals for pulling up an output signal and pull-down code signals for pulling down the output signal according to an external resistor.

According to further embodiments, the impedance calibration circuit, wherein the operation control signal is disabled when the external command signal is enabled.

According to further embodiments, an impedance calibration circuit includes a latch pulse generator and a control signal generator. The latch pulse generator generates a latch pulse signal enabled when temperature code signals having a logic combination corresponding to a second temperature are inputted thereto after the temperature code signals having a logic combination corresponding to a first temperature are inputted thereto. The control signal generator generates an operation control signal which is initialized in response to a first reset signal and which is enabled in response to the latch pulse signal. The operation control signal is a signal for generating pull-up code signals for pulling up an output signal and pull-down code signals for pulling down the output signal according to an external resistor.

According to further embodiments, an impedance calibration circuit includes an operation control signal generator suitable for receiving temperature code signals to generate an operation control signal enabled when an internal temperature is changed from a first temperature to a second temperature; and an impedance calibrator configured to receive an external command signal or the operation control signal to generate a calibration signal when at least one of the external command signal and the operation control signal is enabled.

According to further embodiments, a system includes: a processor; a chipset configured to couple with the processor; a memory controller configured to receive an external command signal from the processor through the chipset; and a memory device configured to receive the external command signal from the memory controller, wherein the memory device includes an impedance calibration circuit including: an impedance calibration circuit includes an operation control signal generator suitable for receiving temperature code signals to generate an operation control signal enabled when an internal temperature is changed from a first temperature to a second temperature; and an impedance calibrator configured to receive an external command signal or the operation control signal to generate a calibration signal when at least one of the external command signal and the operation control signal is enabled.

BRIEF DESCRIPTION OF THE DRAWINGS

Embodiments of the present invention will become more apparent in view of the attached drawings and accompanying detailed description, in which.

DETAILED DESCRIPTION

Various embodiments will be described hereinafter with reference to the accompanying drawings. However, the embodiments described herein are for illustrative purposes only and are not intended to limit the scope of the present invention.

Figure 1:
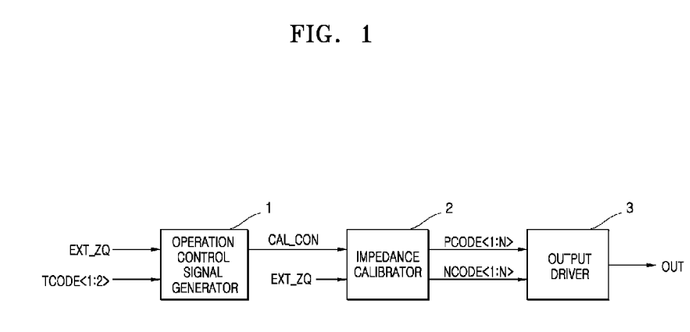
FIG. 1 is a block diagram illustrating an impedance calibration circuit according to an embodiment of the present invention.

Referring to FIG. 1, an impedance calibration circuit according to an embodiment may include an operation control signal generator 1, an impedance calibrator 2 and an output driver 3.

The operation control signal generator 1 may generate an operation control signal CAL_CON initialized by an external command signal EXT_ZQ. The operation control signal generator 1 may generate the operation control signal CAL_CON enabled when an internal temperature of a semiconductor device is changed from a first temperature (e.g., 0 degree Celsius) to a second temperature (e.g., 100 degrees Celsius) according to a logic combination of first and second temperature code signals TCODE<1:2> corresponding to the internal temperature of the semiconductor device. Further, the operation control signal generator 1 may generate the operation control signal CAL_CON enabled even when the internal temperature of the semiconductor device is changed from the second temperature (e.g., 100 degrees Celsius) to the first temperature (e.g., 0 degree Celsius) according to a logic combination of the first and second temperature code signals TCODE<1:2> corresponding to the internal temperature of the semiconductor device. The external command signal EXT_ZQ may be supplied from an external device to execute an impedance matching operation.

Various logic combinations of the first and second temperature code signals TCODE<1:2> corresponding to the internal temperatures of the semiconductor device will be described in detail hereinafter with reference to the following Table 1.

TABLE 1

| Logic Combination of First and Second temperature Code Signals | Internal Temperature | Second Temperature Code Signal (TCODE<2>) | First Temperature Code Signal (TCODE<1>) |
|---|---|---|---|
| First Combination | 0° C. | L | L |
| Second Combination | 65° C. | L | H |
| Third Combination | 85° C. | H | L |
| Fourth Combination | 100° C. | H | H |

As can be seen from the table 1, the first and second temperature code signals TCODE<1:2> may be set to have a first logic combination when the semiconductor device has the internal temperature of 0° C. The first logic combination means that the first and second temperature code signals TCODE<1:2> have a logic "low(L)" level and a logic "low (L)" level, respectively.

The first and second temperature code signals TCODE<1:2> may be set to have a second logic combination when the semiconductor device has the internal temperature of 65° C. The second logic combination means that the first and second temperature code signals TCODE<1:2> have a logic "high (H)" level and a logic "low(L)" level, respectively.

The first and second temperature code signals TCODE<1:2> may be set to have a third logic combination when the semiconductor device has the internal temperature of 85° C. The third logic combination means that the first and second temperature code signals TCODE<1:2> have a logic "low (L)" level and a logic "high(H)" level, respectively.

The first and second temperature code signals TCODE<1:2> may be set to have a fourth logic combination when the semiconductor device has the internal temperature of 100° C. The fourth logic combination means that the first and second temperature code signals TCODE<1:2> have a logic "high (H)" level and a logic "high(H)" level, respectively.

The logic combinations of the first and second temperature code signals TCODE<1:2> may be set to be different according to the embodiments. Additionally, the corresponding internal temperatures for the logic combinations of the first and second temperature code signals may be set differently for different embodiments.

The impedance calibrator 2 may execute an impedance matching operation in response to the external command signal EXT_ZQ or the operation control signal CAL_CON to generate pull-up code signals PCODE<1:N> for pulling up an output signal OUT according to an external resistor and pull-down code signals NCODE<1:N> for pulling down the output signal OUT.

The output driver 3 may have an internal resistance value controlled by the pull-up code signals PCODE<1:N> and the pull-down code signals NCODE<1:N> and may output the output signal OUT whose level is determined according to the internal resistance value thereof.

A configuration of the operation control signal generator 1 will be described more fully hereinafter with reference to FIG. 2.

Figure 2:
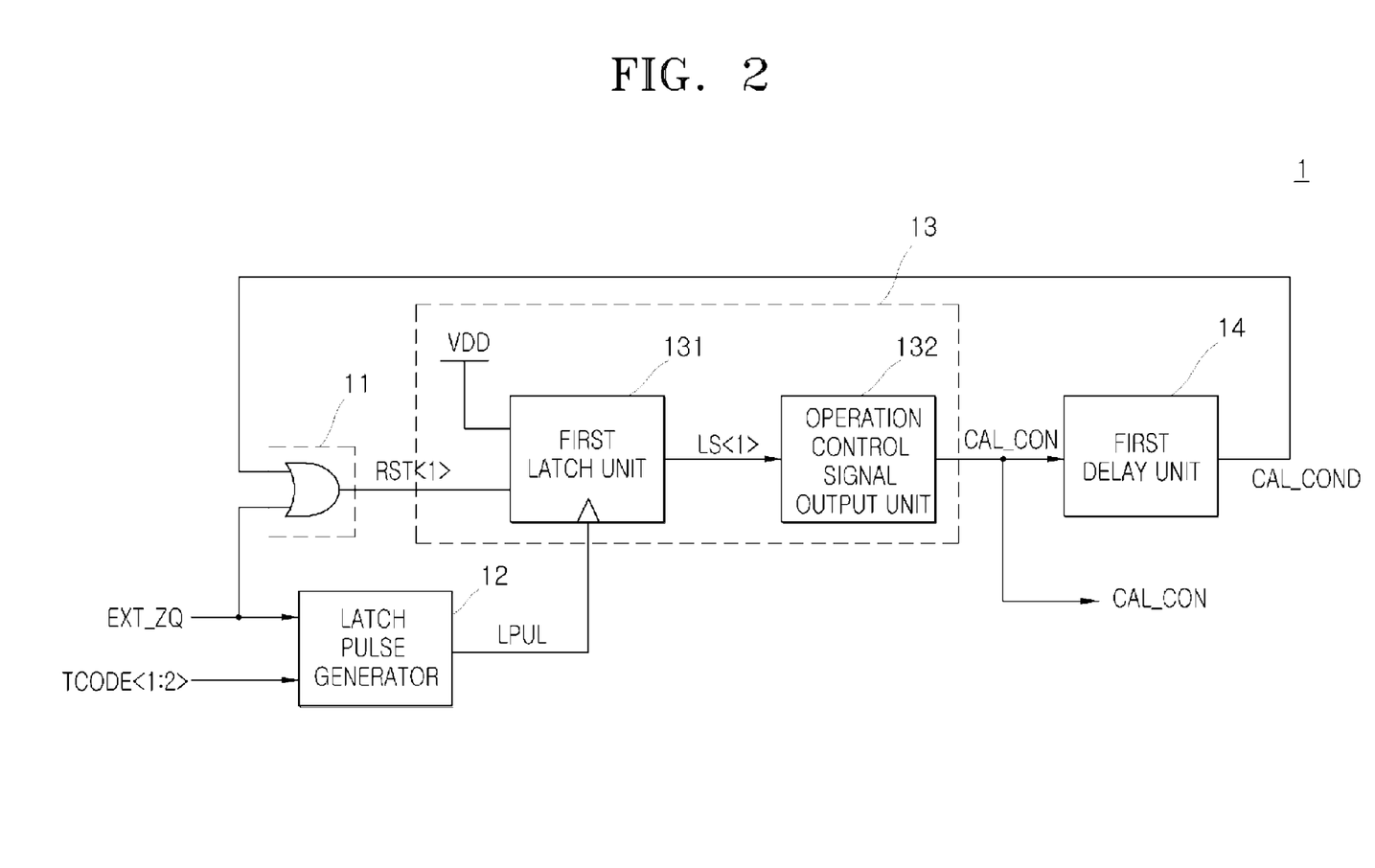
FIG. 2 is a block diagram illustrating an operation control signal generator included in the impedance calibration circuit of FIG. 1.

Referring to FIG. 2, the operation control signal generator 1 may include a first logic unit 11, a latch pulse generator 12, a control signal generator 13 and a first delay unit 14.

The a first logic unit 11 may generate a first reset signal RST<1> enabled to have a logic "high" level if at least one of the external command signal EXT_ZQ and an operation delay signal CAL_COND is inputted thereto. The first logic unit 11 may include an OR logic gate or any equivalent thereof.

The latch pulse generator 12 may generate a latch pulse signal LPUL which is initialized to have a logic "low" level if the external command signal EXT_ZQ is inputted thereto. The latch pulse generator 12 may generate the latch pulse signal LPUL including a pulse which is created when the first and second temperature code signals TCODE<1:2> having the fourth logic combination corresponding to the second temperature (i.e., 100° C.) are inputted thereto after the first and second temperature code signals TCODE<1:2> having the first logic combination corresponding to the first temperature (i.e., 0° C.) are inputted thereto. Further, the latch pulse generator 12 may generate the latch pulse signal LPUL including a pulse which is created even when the first and second temperature code signals TCODE<1:2> having the first logic combination corresponding to the first temperature (i.e., 0° C.) are inputted thereto after the first and second temperature code signals TCODE<1:2> having the fourth logic combination corresponding to the second temperature (i.e., 100° C.) are inputted thereto.

The control signal generator 13 may include a first latch unit 131 and an operation control signal output unit 132. The first latch unit 131 may generate a first latch signal LS<1> initialized to have a logic "low" level when the first reset signal RST<1> is inputted thereto. Further, the first latch unit 131 may latch a power supply voltage VDD signal to generate the first latch signal LS<1> having a logic "high" level when the latch pulse signal LPUL is inputted thereto. The operation control signal output unit 132 may generate the operation control signal CAL_CON including a pulse which is created when the first latch signal LS<1> having a logic "high" level is inputted thereto.

The first delay unit 14 may retard the operation control signal CAL_CON by a predetermined delay time to generate the operation delay signal CAL_COND.

A configuration of the latch pulse generator 12 will be described more fully hereinafter with reference to FIG. 3.

Figure 3:
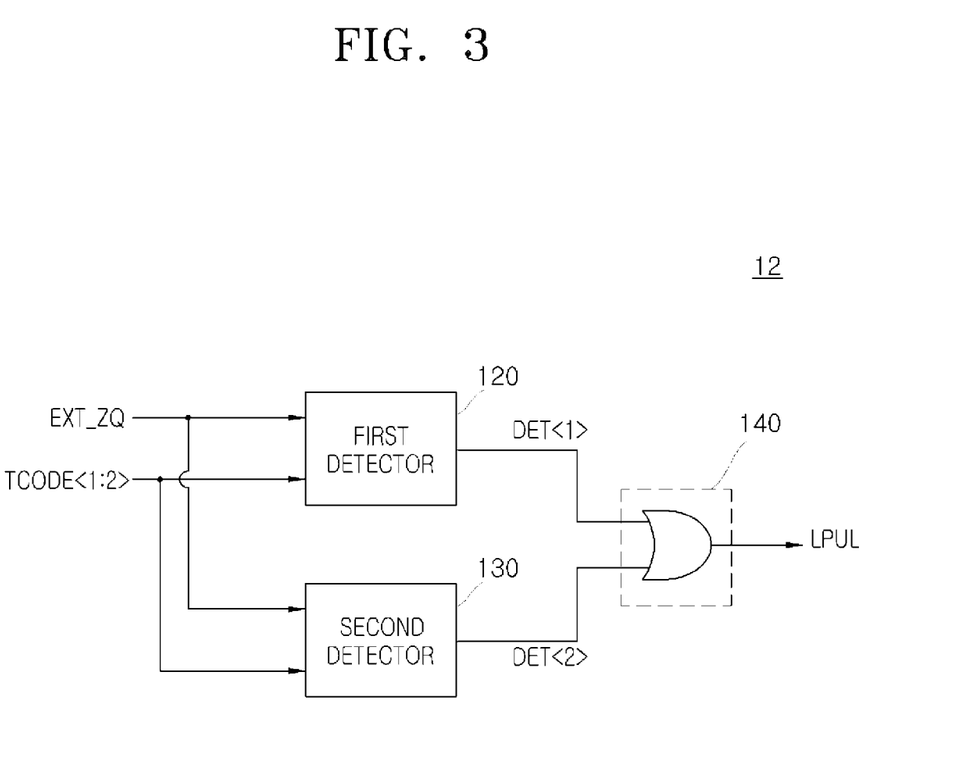
FIG. 3 is a block diagram illustrating a latch pulse generator included in the operation control signal generator of FIG. 2.

Referring to FIG. 3, the latch pulse generator 12 may include a first detector 120, a second detector 130 and a second logic unit 140.

The first detector 120 may generate a first detection signal DET<1> which is initialized to have a logic "low" level when the external command signal EXT_ZQ is inputted thereto and which is enabled to have a logic "high" level when the first and second temperature code signals TCODE<1:2> having the fourth logic combination are inputted thereto after the first and second temperature code signals TCODE<1:2> having the first logic combination are inputted thereto.

The second detector 130 may generate a second detection signal DET<2> which is initialized to have a logic "low" level when the external command signal EXT_ZQ is inputted thereto and which is enabled to have a logic "high" level when the first and second temperature code signals TCODE<1:2> having the first logic combination are inputted thereto after the first and second temperature code signals TCODE<1:2> having the fourth logic combination are inputted thereto. The second detector 130 may have substantially the same configuration as the first detector 120 except for the input levels of the first and second temperature code signals TCODE<1:2>.

The second logic unit 140 may generate the latch pulse signal LPUL enabled to have a logic "high" level when at least one of the first and second detection signals DET<1:2> has a logic "high" level. The second logic unit 140 may include an OR logic gate or any equivalent thereof.

A configuration of the first detector 120 will be described more fully hereinafter with reference to FIG. 4.

Figure 4:
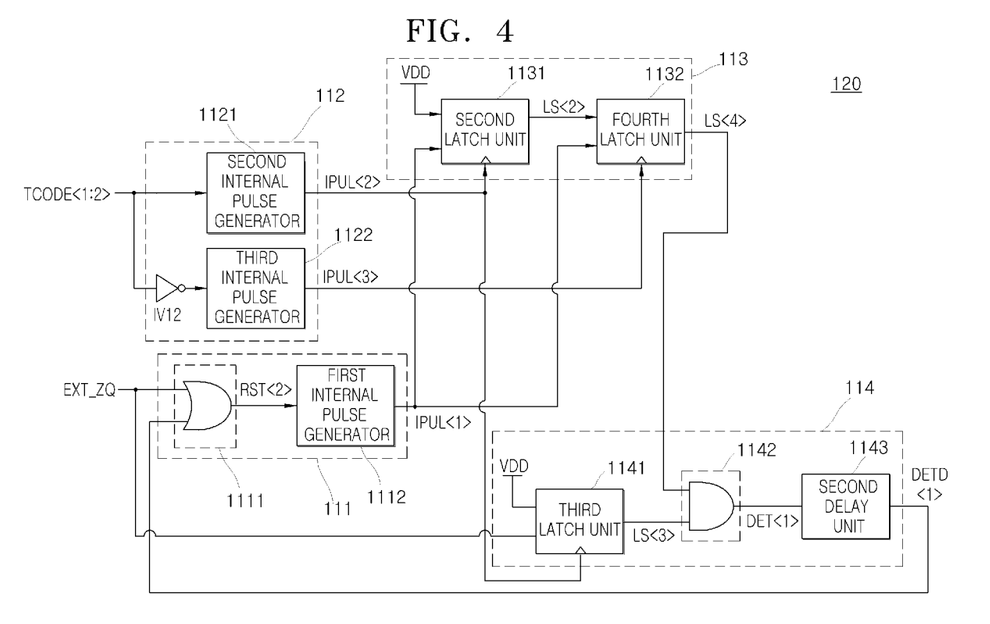
FIG. 4 is a block diagram illustrating a first detector included in the latch pulse generator of FIG. 3.

Referring to FIG. 4, the first detector 120 may include a first pulse generator 111, a second pulse generator 112, a first latch signal generator 113 and a first detection signal generator 114.

The first pulse generator 111 may include a third logic unit 1111 and a first internal pulse generator 1112. The third logic unit 1111 may generate a second reset signal RST<2> enabled to have a logic "high" level when at least one of the external command signal EXT_ZQ and a first delay detection signal DETD<1> has a logic "high" level. The third logic unit 1111 may include an OR logic gate or any equivalent thereof. The first internal pulse generator 1112 may generate a first internal pulse signal IPUL<1> including a pulse which is created when the second reset signal RST<2> is enabled to have a logic "high" level.

The second pulse generator 112 may include a second internal pulse generator 1121 and a third internal pulse generator 1122. The second internal pulse generator 1121 may generate a second internal pulse signal IPUL<2> including a pulse which is created when the first and second temperature code signals TCODE<1:2> having the first logic combination are inputted thereto. The third internal pulse generator 1122 may generate a third internal pulse signal IPUL<3> including a pulse which is created when complementary signals of the first and second temperature code signals TCODE<1:2>, which are inverted by an inverter IV12, have the first logic combination. That is, the third internal pulse generator 1122 may generate the third internal pulse signal IPUL<3> including a pulse which is created when the first and second temperature code signals TCODE<1:2> have the fourth logic combination. The third internal pulse generator 1122 may have substantially the same configuration as the second internal pulse generator 1121 except the input levels of the first and second temperature code signals TCODE<1:2>.

The first latch signal generator 113 may include a second latch unit 1131 and a fourth latch unit 1132. The second latch unit 1131 may generate a second latch signal LS<2> which is initialized to have a logic "low" level when a pulse of the first internal pulse signal IPUL<1> is inputted thereto. Further, the second latch unit 1131 may latch the power supply voltage VDD signal to generate the second latch signal LS<2> having a logic "high" level when a pulse of the second internal pulse signal IPUL<2> is inputted thereto. The fourth latch unit 1132 may generate a fourth latch signal LS<4> which is initialized to have a logic "low" level when a pulse of the first internal pulse signal IPUL<1> is inputted thereto. Further, the fourth latch unit 1132 may latch the second latch signal LS<2> to generate the fourth latch signal LS<4> having a logic "high" level when a pulse of the third internal pulse signal IPUL<3> is inputted thereto.

The first detection signal generator 114 may include a third latch unit 1141, a fourth logic unit 1142 and a second delay unit 1143. The third latch unit 1141 may generate a third latch signal LS<3> which is initialized to have a logic "low" level when the external command signal EXT_ZQ is inputted thereto. Further, the third latch unit 1141 may latch the power supply voltage VDD signal to generate the third latch signal LS<3> having a logic "high" level when a pulse of the second internal pulse signal IPUL<2> is inputted thereto. The fourth logic unit 1142 may generate the first detection signal DET<1> enabled to have a logic "high" level when the fourth latch signal LS<4> having a logic "high" level is inputted thereto after the third latch signal LS<3> having a logic "high" level is inputted thereto. The fourth logic unit 1142 may include an AND logic gate or any equivalent thereof. The second delay unit 1143 may retard the first detection signal DET<1> by a predetermined delay time to generate the first delay detection signal DETD<1>.

A configuration of the second internal pulse generator 1121 will be described more fully hereinafter with reference to FIG. 5.

Figure 5:
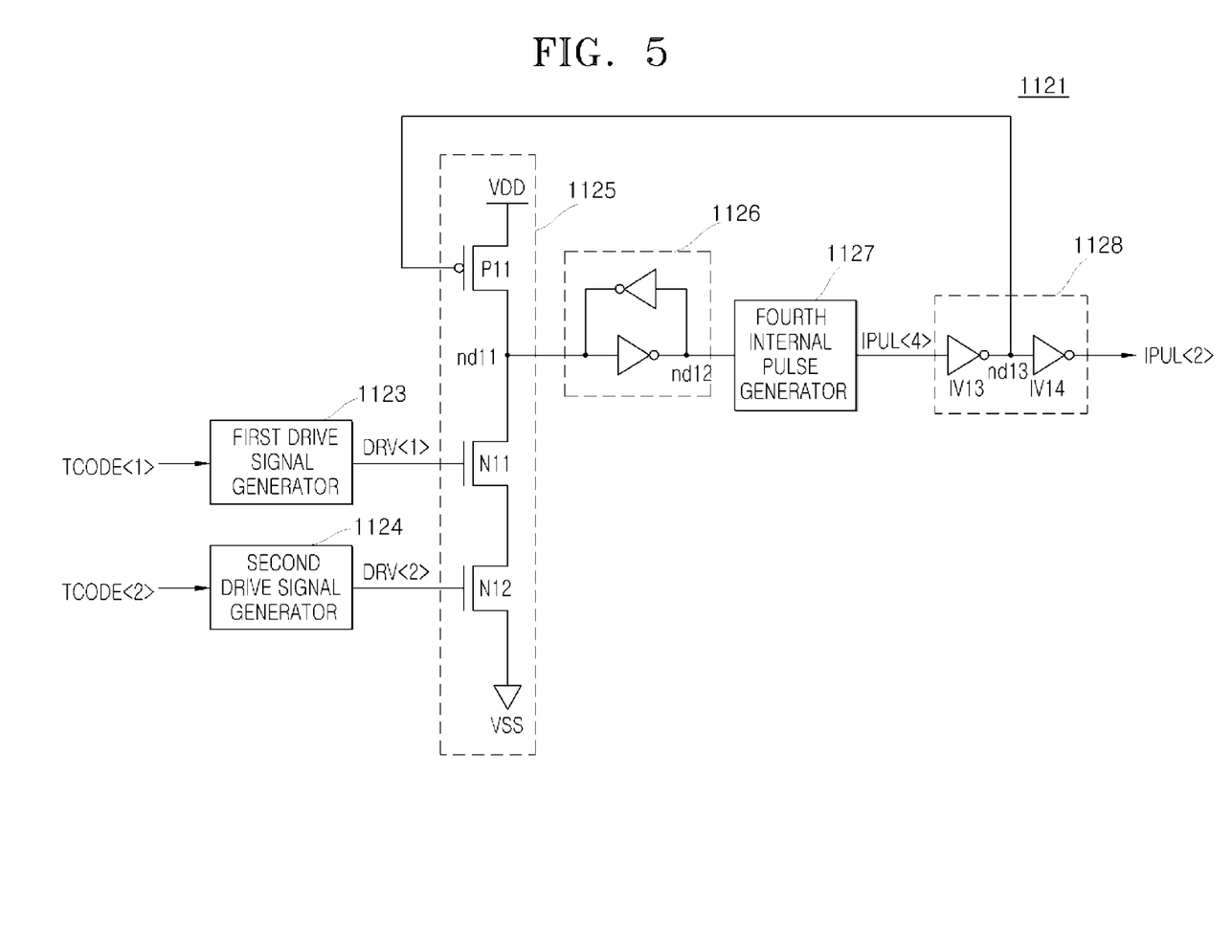
FIG. 5 is a block diagram illustrating a second internal pulse generator included in the first detector of FIG. 4.

Referring to FIG. 5, the second internal pulse generator 1121 may include a first drive signal generator 1123, a second drive signal generator 1124, a driver 1125, a latch unit 1126, a fourth internal pulse generator 1127 and a buffer unit 1128.

The first drive signal generator 1123 may generate a first drive signal DRV<1> including a pulse whose level is a logic "high" level when the first temperature code signal TCODE<1> having a logic "low" level is inputted thereto.

The second drive signal generator 1124 may generate a second drive signal DRV<2> including a pulse whose level is a logic "high" level when the second temperature code signal TCODE<2> having a logic "low" level is inputted thereto.

The driver 1125 may include a PMOS transistor P11 coupled between a power supply voltage VDD terminal and a node ND11 and NMOS transistors N11 and N12 serially coupled between the node ND11 and a ground voltage VSS terminal. The NMOS transistor N11 may operate in response to the first drive signal DRV<1> and the NMOS transistor N12 may operate in response to the second drive signal DRV<2>. Thus, the NMOS transistors N11 and N12 may be turned on to pull down the node ND11 when the first and second drive signals DRV<1:2> have a logic "high" level. The PMOS transistor P11 may operate in response to a signal of a node ND13. Thus, the PMOS transistor P11 may be turned on to pull up the node ND11 when the node ND13 is driven to have a logic "low" level. In some embodiments, the node ND11 of the driver 1125 may be initialized to have a logic "high" level.

The latch unit 1126 may latch a signal of the node ND11 and may inversely buffer the signal of the node ND11 to output the inversely buffered signal through a node ND12.

The fourth internal pulse generator 1127 may generate a fourth internal pulse signal IPUL<4> including a pulse which is created when the node ND12 is driven to have a logic "high" level.

The buffer unit 1128 may include an inverter IV13 that inversely buffers the fourth internal pulse signal IPUL<4> to output the inversely buffered signal of the fourth internal pulse signal IPUL<4> through the node ND13 and an inverter IV14 that inversely buffers a signal of the node ND13 to output the inversely buffered signal of the node ND13 as the second internal pulse signal IPUL<2>.

As a result, the second internal pulse generator 1121 may generate the second internal pulse signal IPUL<2> including a pulse which is created when the first and second temperature code signals TCODE<1:2> have a logic "low" level.

The third internal pulse generator 1122 may have substantially the same configuration as the second internal pulse generator 1121 except for the input levels of the first and second temperature code signals TCODE<1:2>. Thus, a detailed description of the third internal pulse generator 1122 will be omitted to avoid a duplicate explanation.

A configuration of the impedance calibrator 2 will be described more fully hereinafter with reference to FIG. 6.

Figure 6:
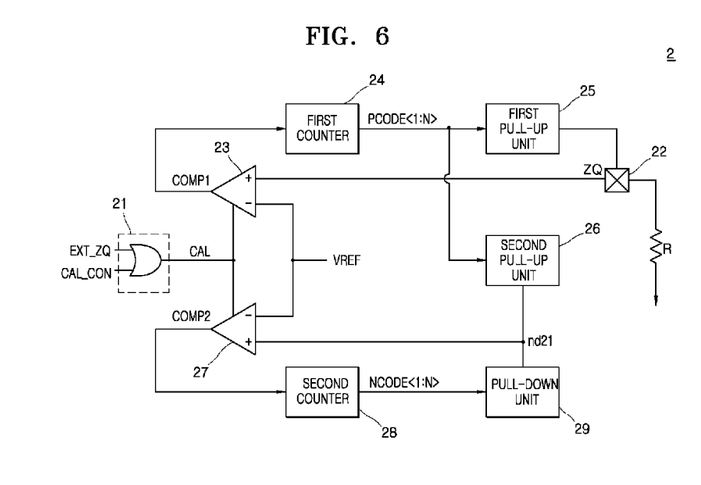
FIG. 6 is a block diagram illustrating an impedance calibrator included in the impedance calibration circuit of FIG. 1.

Referring to FIG. 6, the impedance calibrator 2 may include a calibration signal generator 21, a pad 22 connected to an external resistor R, a first comparator 23, a second comparator 27, a first counter 24, a second counter 28, a first pull-up unit 25, a second pull-up unit 26 and a pull-down unit 29.

The calibration signal generator 21 may generate a calibration signal CAL having a logic "high" level when at least one of the external command signal EXT_ZQ and the operation control signal CAL_CON has a logic "high" level.

The first comparator 23 may be driven by the calibration signal CAL having a logic "high" level and may compare a voltage signal ZQ of the pad 22 with a reference voltage signal VREF to generate a first comparison signal COMP1.

The first counter 24 may execute a counting operation in response to the first comparison signal COMP1 to output the pull-up code signals PCODE<1:N> that are counted to adjust resistance values of the first and second pull-up units 25 and 26 so that the first and second pull-up units 25 and 26 have the same resistance value as the external resistor R. If the resistance values of the first and second pull-up units 25 and 26 are adjusted by the pull-up code signals PCODE<1:N> to be equal to the resistance value of the external resistor R, an operation of the first counter 24 may be terminated.

The second comparator 27 may be driven by the calibration signal CAL having a logic "high" level and may compare a voltage signal of a node ND21 between the second pull-up unit 26 and the pull-down unit 29 with the reference voltage signal VREF to generate a second comparison signal COMP2. A voltage level of the node ND21 may be equal to a resistance value of the second pull-up unit 26.

The second counter 28 may execute a counting operation in response to the second comparison signal COMP2 to output the pull-down code signals NCODE<1:N> that are counted to adjust a resistance value of the pull-down unit 29 so that the pull-down unit 29 has the same resistance value as the second pull-up unit 26. If the resistance value of the pull-down unit 29 is adjusted by the pull-down code signals NCODE<1:N> to be equal to the resistance value of the second pull-up unit 26, an operation of the second counter 28 may be terminated.

Figure 7:
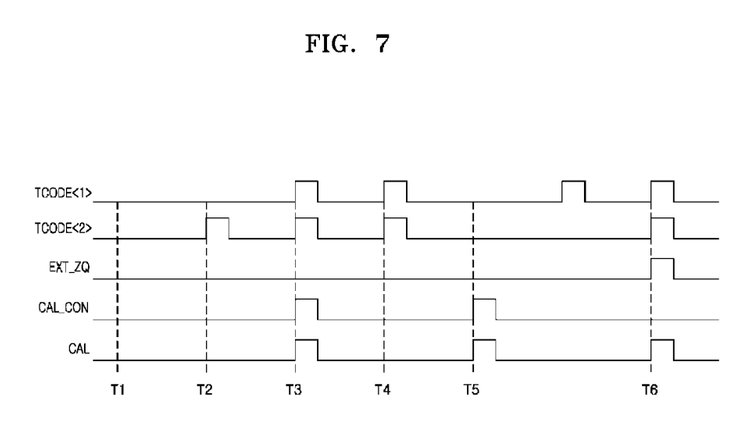
FIG. 7 is a timing diagram illustrating an operation of the impedance calibration circuit shown in FIG. 1.

An operation of the impedance calibration circuit having the aforementioned configuration will be described hereinafter with reference to FIG. 7 in conjunction with an example in which an internal temperature of a semiconductor device is changed from 0° C. to 100° C., an example in which the internal temperature of the semiconductor device is changed from 100° C. to 0° C., and an example in which an impedance matching operation is executed by the external command signal EXT_ZQ.

First, an operation of the impedance calibration circuit will be described hereinafter in conjunction with the example in which the internal temperature of the semiconductor device is changed from 0° C. to 100° C.

At a point of time "T1", if internally the semiconductor device is 0° C., the first temperature code signal TCODE<1> may have a logic "low" level and the second temperature code signal TCODE<2> may have a logic "low" level. That is, the first and second temperature code signals TCODE<1:2> having the first logic combination (see Table 1) may be inputted to the impedance calibration circuit at the point of time "T1".

The first logic unit 11 of the operation control signal generator 1 may generate the first reset signal RST<1> having a logic "low" level because the external command signal EXT_ZQ has a logic "low" level.

The latch pulse generator 12 of the operation control signal generator 1 does not generate any pulses of the latch pulse signal LPUL because the external command signal EXT_ZQ having a logic "low" level is inputted thereto and the first and second temperature code signals TCODE<1:2> having the first logic combination are inputted thereto.

The control signal generator 13 of the operation control signal generator 1 does not generate any pulses of the operation control signal CAL_CON because no pulse of the latch pulse signal LPUL is inputted thereto.

The calibration signal generator 21 of the impedance calibrator 2 may generate the calibration signal CAL having a logic "low" level in response to the external command signal EXT_ZQ having a logic "low" level and the operation control signal CAL_CON having a logic "low" level. Thus, the impedance calibrator 2 does not execute an impedance matching operation.

At a point of time "T2", if internally the semiconductor device is 85° C., the first temperature code signal TCODE<1> may have a logic "low" level and the second temperature code signal TCODE<2> may have a logic "high" level. That is, the first and second temperature code signals TCODE<1:2> having the third logic combination (see Table 1) may be inputted to the impedance calibration circuit at the point of time "T2".

The first logic unit 11 of the operation control signal generator 1 may generate the first reset signal RST<1> having a logic "low" level because the external command signal EXT_ZQ has a logic "low" level.

The latch pulse generator 12 of the operation control signal generator 1 does not generate any pulses of the latch pulse signal LPUL because the external command signal EXT_ZQ having a logic "low" level is inputted thereto and the first and second temperature code signals TCODE<1:2> having the third logic combination are inputted thereto.

The control signal generator 13 of the operation control signal generator 1 does not generate any pulses of the operation control signal CAL_CON because no pulse of the latch pulse signal LPUL is inputted thereto.

The calibration signal generator 21 of the impedance calibrator 2 may generate the calibration signal CAL having a logic "low" level in response to the external command signal EXT_ZQ having a logic "low" level and the operation control signal CAL_CON having a logic "low" level. Thus, the impedance calibrator 2 does not execute an impedance matching operation.

At a point of time "T3", if internally the semiconductor device is 100° C., the first temperature code signal TCODE<1> may have a logic "high" level and the second temperature code signal TCODE<2> may have a logic "high" level. That is, the first and second temperature code signals TCODE<1:2> having the fourth logic combination (see Table 4) may be inputted to the impedance calibration circuit at the point of time "T3".

The first logic unit 11 of the operation control signal generator 1 may generate the first reset signal RST<1> having a logic "low" level because the external command signal EXT_ZQ has a logic "low" level.

The latch pulse generator 12 of the operation control signal generator 1 may generate the latch pulse signal LPUL including a pulse that has a logic "high" level because the external command signal EXT_ZQ having a logic "low" level is inputted thereto and the first and second temperature code signals TCODE<1:2> having the fourth logic combination are inputted thereto after the first and second temperature code signals TCODE<1:2> having the first logic combination are inputted thereto at the point of time "T1".

The control signal generator 13 of the operation control signal generator 1 may receive a pulse of the latch pulse signal LPUL to generate the operation control signal CAL_CON including a pulse that has a logic "high" level.

The calibration signal generator 21 of the impedance calibrator 2 may receive the external command signal EXT_ZQ having a logic "low" level and the operation control signal CAL_CON having a logic "high" level to generate the calibration signal CAL having a logic "high" level. Thus, the impedance calibrator 2 may execute an impedance matching operation to generate the pull-up code signals PCODE<1:N> and the pull-down code signals NCODE<1:N>.

The output driver 3 may receive the pull-up code signals PCODE<1:N> and the pull-down code signals NCODE<1:N> to output the output signal OUT.

Next, an operation of the impedance calibration circuit will be described hereinafter in conjunction with the example in which the internal temperature of the semiconductor device is changed from 100° C. to 0° C.

At a point of time "T4", if internally the semiconductor device is 100° C., the first temperature code signal TCODE<1> may have a logic "high" level and the second temperature code signal TCODE<2> may have a logic "high" level. That is, the first and second temperature code signals TCODE<1:2> having the fourth logic combination (see Table 1) may be inputted to the impedance calibration circuit at the point of time "T4".

The first logic unit 11 of the operation control signal generator 1 may generate the first reset signal RST<1> having a logic "low" level because the external command signal EXT_ZQ has a logic "low" level.

The latch pulse generator 12 of the operation control signal generator 1 does not generate any pulses of the latch pulse signal LPUL because the external command signal EXT_ZQ having a logic "low" level is inputted thereto and the first and second temperature code signals TCODE<1:2> having the fourth logic combination are inputted thereto.

The control signal generator 13 of the operation control signal generator 1 does not generate any pulses of the operation control signal CAL_CON because no pulse of the latch pulse signal LPUL is inputted thereto.

The calibration signal generator 21 of the impedance calibrator 2 may generate the calibration signal CAL having a logic "low" level in response to the external command signal EXT_ZQ having a logic "low" level and the operation control signal CAL_CON having a logic "low" level. Thus, the impedance calibrator 2 does not execute an impedance matching operation.

At a point of time "T5", if internally the semiconductor device is 0° C., the first temperature code signal TCODE<1> may have a logic "low" level and the second temperature code signal TCODE<2> may have a logic "low" level. That is, the first and second temperature code signals TCODE<1:2> having the first logic combination (see Table 1) may be inputted to the impedance calibration circuit at the point of time "T5".

The first logic unit 11 of the operation control signal generator 1 may generate the first reset signal RST<1> having a logic "low" level because the external command signal EXT_ZQ has a logic "low" level.

The latch pulse generator 12 of the operation control signal generator 1 may generate the latch pulse signal LPUL including a pulse that has a logic "high" level because the external command signal EXT_ZQ having a logic "low" level is inputted thereto and the first and second temperature code signals TCODE<1:2> having the first logic combination are inputted thereto.

The control signal generator 13 of the operation control signal generator 1 may receive the latch pulse signal LPUL having a logic "high" level to generate the operation control signal CAL_CON including a pulse that has a logic "high" level.

The calibration signal generator 21 of the impedance calibrator 2 may generate the calibration signal CAL having a logic "high" level in response to the external command signal EXT_ZQ having a logic "low" level and the operation control signal CAL_CON having a logic "high" level. Thus, the impedance calibrator 2 may execute an impedance matching operation to generate the pull-up code signals PCODE<1:N> and the pull-down code signals NCODE<1:N>.

The output driver 3 may receive the pull-up code signals PCODE<1:N> and the pull-down code signals NCODE<1:N> to output the output signal OUT.

Finally, an operation of the impedance calibration circuit will be described hereinafter in conjunction with the example in which an impedance matching operation is executed by the external command signal EXT_ZQ.

At a point of time "T6", the external command signal EXT_ZQ including a pulse for executing an impedance matching operation may be inputted to the impedance calibration circuit.

The first logic unit 11 of the operation control signal generator 1 may receive the external command signal EXT_ZQ including the pulse having a logic "high" level to generate the first reset signal RST<1> having a logic "high" level.

The latch pulse generator 12 of the operation control signal generator 1 may receive the external command signal EXT_ZQ including the pulse having a logic "high" level to generate the latch pulse signal LPUL having a logic "low" level.

The control signal generator 13 of the operation control signal generator 1 may receive the reset signal RST<1> having a logic "high" level to generate the operation control signal CAL_CON having a logic "low" level.

The calibration signal generator 21 of the impedance calibrator 2 may receive the external command signal EXT_ZQ having a logic "high" level and the operation control signal CAL_CON having a logic "low" level to generate the calibration signal CAL having a logic "high" level. Thus, the impedance calibrator 2 may execute an impedance matching operation to generate the pull-up code signals PCODE<1:N> and the pull-down code signals NCODE<1:N>.

The output driver 3 may receive the pull-up code signals PCODE<1:N> and the pull-down code signals NCODE<1:N> to output the output signal OUT.

As described above, an impedance calibration circuit according to the embodiments may execute an impedance matching operation without reception of an external command signal by generating an operation control signal for internally executing an impedance calibration operation when an internal temperature of a semiconductor device is changed within a relatively high range. Thus, even though the internal temperature of the semiconductor device is changed within a relatively high range, a reflection of an output signal of the impedance calibration circuit may be suppressed.

Additionally, the impedance calibration circuit as discussed above is particular useful in the design of memory devices, processors, and computer systems. For example, referring to FIG. 8, a block diagram of a system employing a impedance calibration circuit in accordance with embodiments of the invention is illustrated and generally designated by a reference numeral 1000. The system 1000 may include one or more processors or central processing units ("CPUs") 1100. The CPU 1100 may be used individually or in combination with other CPUs. While the CPU 1100 will be referred to primarily in the singular, it will be understood by those skilled in the art that a system with any number of physical or logical CPUs may be implemented.

Figure 8:
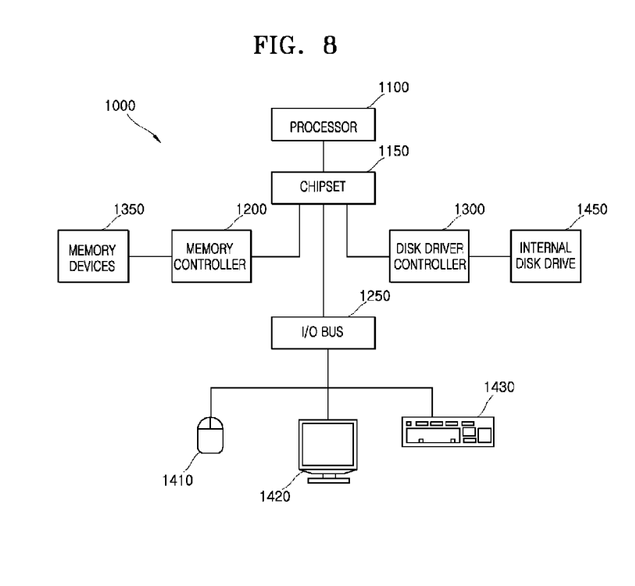
FIG. 8 illustrates a block diagram of a system employing a impedance calibration circuit in accordance with the various embodiments discussed above with regards to FIGS. 1-7.

A chipset 1150 may be operably coupled to the CPU 1100. The chipset 1150 is a communication pathway for signals between the CPU 1100 and other components of the system 1000, which may include a memory controller 1200, an input/output ("I/O") bus 1250, and a disk drive controller 1300. Depending on the configuration of the system, any one of a number of different signals may be transmitted through the chipset 1150, and those skilled in the art will appreciate that the routing of the signals throughout the system 1000 can be readily adjusted without changing the underlying nature of the system.

As stated above, the memory controller 1200 may be operably coupled to the chipset 1150. Thus, the memory controller 1200 can receive a request provided from the CPU 1100, through the chipset 1150. In alternate embodiments, the memory controller 1200 may be integrated into the chipset 1150. The memory controller 1200 may be operably coupled to one or more memory devices 1350. The memory devices 1350 may include the impedance calibration circuit as discussed above with regards to FIGS. 1-7. The memory devices 1350 may be any one of a number of industry standard memory types, including but not limited to, single inline memory modules ("SIMMs") and dual inline memory modules ("DIMMs"). Further, the memory devices 1350 may facilitate the safe removal of the external data storage devices by storing both instructions and data.

The chipset 1150 may also be coupled to the I/O bus 1250. The I/O bus 1250 may serve as a communication pathway for signals from the chipset 1150 to I/O devices 1410, 1420 and 1430. The I/O devices 1410, 1420 and 1430 may include a mouse 1410, a video display 1420, or a keyboard 1430. The I/O bus 1250 may employ any one of a number of communications protocols to communicate with the I/O devices 1410, 1420, and 1430. Further, the I/O bus 1250 may be integrated into the chipset 1150.

The disk drive controller 1450 may also be operably coupled to the chipset 1150. The disk drive controller 1450 may serve as the communication pathway between the chipset 1150 and one or more internal disk drives 1450. The internal disk drive 1450 may facilitate disconnection of the external data storage devices by storing both instructions and data. The disk drive controller 1300 and the internal disk drives 1450 may communicate with each other or with the chipset 1150 using virtually any type of communication protocol, including all of those mentioned above with regard to the I/O bus 1250.

It is important to note that the system 1000 described above in relation to FIG. 8 is merely one example of a system employing a an impedance calibration circuit and according to the embodiments may execute an impedance matching operation without reception of an external command signal by generating an operation control signal for internally executing an impedance calibration operation when an internal temperature of a semiconductor device is changed within a relatively high range. Thus, even though the internal temperature of the semiconductor device is changed within a relatively high range, a reflection of an output signal of the impedance calibration circuit may be suppressed. In alternate embodiments, such as cellular phones or digital cameras, the components may differ from the embodiment shown in FIG. 8.

What is claimed is:

1. An impedance calibration circuit comprising:
   a first logic unit suitable for generating a first reset signal enabled when at least one of an external command signal and an operation delay signal is enabled;
   a latch pulse generator suitable for generating a latch pulse signal enabled when temperature code signals having a logic combination corresponding to a second temperature are inputted thereto after the temperature code signals having a logic combination corresponding to a first temperature are inputted thereto;
   a control signal generator suitable for generating the operation control signal which is initialized in response to the first reset signal and which is enabled in response to the latch pulse signal;
   a first delay unit suitable for retarding the operation control signal by a predetermined delay time to generate the operation delay signal; and
   an impedance calibrator suitable for receiving the external command signal or the operation control signal to generate pull-up code signals for pulling up an output signal and pull-down code signals for pulling down the output signal according to an external resistor.

2. The impedance calibration circuit of claim 1, wherein the latch pulse generator includes:
   a first detector suitable for generating a first detection signal which is initialized in response to the external command signal and which is enabled when the temperature code signals having a logic combination corresponding to the second temperature are inputted thereto after the temperature code signals having a logic combination corresponding to the first temperature are inputted thereto;
   a second detector suitable for generating a second detection signal which is initialized in response to the external command signal is inputted thereto and which is enabled when the temperature code signals having a logic combination corresponding to the first temperature are inputted thereto after the temperature code signals having a logic combination corresponding to the second temperature are inputted thereto; and
   a second logic unit suitable for generating the latch pulse signal enabled when at least one of the first and second detection signals is enabled.

3. The impedance calibration circuit of claim 2, wherein the first detector includes:
- a first pulse generator suitable for generating a first internal pulse signal including a pulse which is created in response to the external command signal or a first delay detection signal, the first delay detection signal being generated by retarding the first detection signal by a predetermined period;
- a second pulse generator suitable for generating a second internal pulse signal including a pulse which is created when the temperature code signals having a logic combination corresponding to the first temperature are inputted thereto and suitable for generating a third internal pulse signal including a pulse which is created when the temperature code signals having a logic combination corresponding to the second temperature are inputted thereto;
- a first latch signal generator suitable for generating a second latch signal which is initialized in response to the first internal pulse signal and which is latched to have a power supply voltage in response to the second internal pulse signal and suitable for latching the second latch signal in response to the third internal pulse signal to generate a fourth latch signal; and
- a first detection signal generator suitable for generating a third latch signal which is initialized in response to the external command signal and which is latched to have the power supply voltage in response to the second internal pulse signal and suitable for generating the first detection signal which is enabled when the fourth latch signal is inputted thereto after the third latch signal is generated.

4. The impedance calibration circuit of claim 3, wherein the first pulse generator includes:
- a third logic unit suitable for generating a second reset signal enabled when at least one of the external command signal and the first delay detection signal is enabled; and
- a first internal pulse generator suitable for generating a first internal pulse signal including a pulse which is created when the second reset signal is enabled.

5. The impedance calibration circuit of claim 3, wherein the second pulse generator includes:
- a second internal pulse generator suitable for generating the second internal pulse signal including the pulse which is created when the temperature code signals having a logic combination corresponding to the first temperature are inputted thereto; and
- a third internal pulse generator suitable for generating the third internal pulse signal including the pulse which is created when the temperature code signals having a logic combination corresponding to the second temperature are inputted thereto.

6. The impedance calibration circuit of claim 3, wherein the first latch signal generator includes:
- a second latch unit suitable for generating the second latch signal which is initialized in response to the first internal pulse signal and which is latched to have the power supply voltage in response to the second internal pulse signal; and
- a fourth latch unit suitable for generating the fourth latch signal which is initialized in response to the first internal pulse signal and suitable for latching the second latch signal in response to the third internal pulse signal to generate the fourth latch signal.

7. The impedance calibration circuit of claim 3, wherein the first detection signal generator includes:
- a third latch unit suitable for generating the third latch signal which is initialized in response to the external command signal and which is latched to have the power supply voltage in response to the second internal pulse signal;
- a fourth logic unit suitable for generating the first detection signal enabled when the fourth latch signal is inputted thereto after the third latch signal is generated; and
- a second delay unit suitable for retarding the first detection signal by a predetermined delay time to generate the first delay detection signal.

8. The impedance calibration circuit of claim 3, wherein the second detector includes:
- a third pulse generator suitable for generating a fourth internal pulse signal including a pulse which is created in response to the external command signal or a second delay detection signal, the second delay detection signal being generated by retarding the second detection signal by a predetermined period;
- a fourth pulse generator suitable for generating a fifth internal pulse signal including a pulse which is created when the temperature code signals having a logic combination corresponding to the second temperature are inputted thereto and suitable for generating a sixth internal pulse signal including a pulse which is created when the temperature code signals having a logic combination corresponding to the first temperature are inputted thereto;
- a second latch signal generator suitable for generating a fifth latch signal which is initialized in response to the fourth internal pulse signal and which is latched to have the power supply voltage in response to the fifth internal pulse signal and suitable for latching the fifth latch signal in response to the sixth internal pulse signal to generate a seventh latch signal; and
- a second detection signal generator suitable for generating a sixth latch signal which is initialized in response to the external command signal and which is latched to have the power supply voltage in response to the fourth internal pulse signal and suitable for generating the second detection signal which is enabled when the seventh latch signal is inputted thereto after the sixth latch signal is generated.

9. The impedance calibration circuit of claim 1, wherein the control signal generator includes:
- a first latch unit suitable for generating a first latch signal which is initialized in response to the first reset signal and which is latched to have a power supply voltage in response to the latch pulse signal; and
- an operation control signal output unit suitable for generating the operation control signal including a pulse which is created in response to the first latch signal.

10. An impedance calibration circuit comprising:
- a latch pulse generator suitable for generating a latch pulse signal enabled when temperature code signals having a logic combination corresponding to a second temperature are inputted thereto after the temperature code signals having a logic combination corresponding to a first temperature are inputted thereto; and
- a control signal generator suitable for generating an operation control signal which is initialized in response to a first reset signal and which is enabled in response to the latch pulse signal,
- wherein the operation control signal is a signal for generating pull-up code signals for pulling up an output signal and pull-down code signals for pulling down the output signal according to an external resistor.

11. The impedance calibration circuit of claim 10, further comprising:
- a first logic unit suitable for generating the first reset signal enabled when at least one of an external command signal and an operation delay signal is enabled; and
- a first delay unit suitable for retarding the operation control signal by a predetermined delay time to generate the operation delay signal.

12. The impedance calibration circuit of claim 10, wherein the latch pulse generator includes:
- a first detector suitable for generating a first detection signal which is initialized in response to an external command signal and which is enabled when the temperature code signals having a logic combination corresponding to the second temperature are inputted thereto after the temperature code signals having a logic combination corresponding to the first temperature are inputted thereto;
- a second detector suitable for generating a second detection signal which is initialized in response to the external command signal and which is enabled when the temperature code signals having a logic combination corresponding to the first temperature are inputted thereto after the temperature code signals having a logic combination corresponding to the second temperature are inputted thereto; and
- a second logic unit suitable for generating the latch pulse signal enabled when at least one of the first and second detection signals is enabled.

13. The impedance calibration circuit of claim 12, wherein the first detector includes:
- a first pulse generator suitable for generating a first internal pulse signal including a pulse which is created in response to the external command signal or a first delay detection signal, the first delay detection signal being generated by retarding the first detection signal by a predetermined period;
- a second pulse generator suitable for generating a second internal pulse signal including a pulse which is created when the temperature code signals having a logic combination corresponding to the first temperature are inputted thereto and suitable for generating a third internal pulse signal including a pulse which is created when the temperature code signals having a logic combination corresponding to the second temperature are inputted thereto;
- a first latch signal generator suitable for generating a second latch signal which is initialized in response to the first internal pulse signal and which is latched to have a power supply voltage in response to the second internal pulse signal and suitable for latching the second latch signal in response to the third internal pulse signal to generate a fourth latch signal; and
- a first detection signal generator suitable for generating a third latch signal which is initialized in response to the external command signal and which is latched to have the power supply voltage in response to the second internal pulse signal and suitable for generating the first detection signal which is enabled when the fourth latch signal is inputted thereto after the third latch signal is generated.

14. The impedance calibration circuit of claim 13, wherein the first pulse generator includes:
- a third logic unit suitable for generating a second reset signal enabled when at least one of the external command signal and the first delay detection signal is enabled; and
- a first internal pulse generator suitable for generating a first internal pulse signal including a pulse which is created when the second reset signal is enabled.

15. The impedance calibration circuit of claim 13, wherein the second pulse generator includes:
- a second internal pulse generator suitable for generating the second internal pulse signal including the pulse which is created when the temperature code signals having a logic combination corresponding to the first temperature are inputted thereto; and
- a third internal pulse generator suitable for generating the third internal pulse signal including the pulse which is created when the temperature code signals having a logic combination corresponding to the second temperature are inputted thereto.

16. The impedance calibration circuit of claim 13, wherein the first latch signal generator includes:
- a second latch unit suitable for generating the second latch signal which is initialized in response to the first internal pulse signal and which is latched to have the power supply voltage in response to the second internal pulse signal; and
- a fourth latch unit suitable for generating the fourth latch signal which is initialized in response to the first internal pulse signal and suitable for latching the second latch signal in response to the third internal pulse signal to generate the fourth latch signal.

17. The impedance calibration circuit of claim 13, wherein the first detection signal generator includes:
- a third latch unit suitable for generating the third latch signal which is initialized in response to the external command signal and which is latched to have the power supply voltage in response to the second internal pulse signal;
- a fourth logic unit suitable for generating the first detection signal enabled when the fourth latch signal is inputted thereto after the third latch signal is generated; and
- a second delay unit suitable for retarding the first detection signal by a predetermined delay time to generate the first delay detection signal.

18. The impedance calibration circuit of claim 10, wherein the control signal generator includes:
- a first latch unit suitable for generating a first latch signal which is initialized in response to the first reset signal and which is latched to have a power supply voltage in response to the latch pulse signal; and
- an operation control signal output unit suitable for generating the operation control signal including a pulse which is created in response to the first latch signal.

* * * * *